(12) United States Patent
Weitekamp

(10) Patent No.: US 6,841,995 B2
(45) Date of Patent: Jan. 11, 2005

(54) RADIATIVE REDUCTION OF ENTROPY

(75) Inventor: Daniel P. Weitekamp, Altadena, CA (US)

(73) Assignee: California Institute of Technology, Pasadeua, CA (US)

(*) Notice: Subject to any disclaimer, the term of this patent is extended or adjusted under 35 U.S.C. 154(b) by 138 days.

(21) Appl. No.: 10/150,658

(22) Filed: May 16, 2002

(65) Prior Publication Data

US 2003/0006852 A1 Jan. 9, 2003

Related U.S. Application Data

(60) Provisional application No. 60/291,734, filed on May 16, 2001.

(51) Int. Cl.[7] .................................................. G01V 3/00
(52) U.S. Cl. ........................ 324/300; 324/307; 324/321
(58) Field of Search ................................. 324/300–322

(56) References Cited

U.S. PATENT DOCUMENTS

| 5,266,896 | A | 11/1993 | Rugar et al. ................ 324/307 |
| 5,397,987 | A | 3/1995 | Garritano .................... 324/307 |
| 5,629,624 | A | 5/1997 | Carlson et al. ............. 324/309 |
| 6,100,687 | A | 8/2000 | Weitekamp et al. ........ 324/300 |
| 2003/0006852 | A1 * | 1/2003 | Weitekamp ................. 331/154 |

OTHER PUBLICATIONS

Boulil et al., From Quantum Mechanical Harmonic Oscillators to Classical Ones through Maximization of Entropy Journal of Chemical Education, 1989 V66, N6, P467–470.*

Ross et al., Fractional revivals of coherence in quantum mechanical oscillators Physica A vol. 287, No. 1–2 p. 217–258.*

* cited by examiner

Primary Examiner—Brij Shrivastav
Assistant Examiner—Tiffany A. Fetzner
(74) Attorney, Agent, or Firm—Fish & Richardson P.C.

(57) ABSTRACT

Techniques and apparatus for causing electromagnetic interaction between an oscillator and a quantum ensemble with transition moments to transfer energy. In implementation, a mechanical oscillator with an electromagnetically polarized moving part is placed close to the quantum ensemble to extract energy from said quantum ensemble so as to reduce an entropy of the quantum ensemble.

20 Claims, 2 Drawing Sheets

RADIATIVE REDUCTION OF ENTROPY

This application claims the benefit of U.S. Provisional Application No. 60/291,734 filed May 16, 2001, the entire disclosure of which is incorporated herein by reference as part of this application.

BACKGROUND

This application relates to techniques for controlling thermodynamic ordering of a system.

In thermodynamics, one fundamental property of matter is the degree of order of the matter. For a matter or a system of particles in thermodynamic equilibrium, this order is determined by the composition of the system and the constraints, such as temperature and pressure, which result in a particular thermodynamic state. One measure of this degree of order is the thermodynamic parameter called entropy. A low entropy corresponds to a high degree of order, or a low degree of chaos. Conversely, a high entropy corresponds to a low degree of order, or a high degree of chaos. For example, thermal cooling of a system, e.g., a decrease in temperature, is generally associated with an increase in order, i.e., a reduction of the entropy of the system. Non-equilibrium states of matter, including states that may not be characterized by a temperature, may also be described or characterized by entropy and other measures of order. A reduction in entropy or a related measure of order is often described as cooling, even when temperature is not well-defined.

SUMMARY

This application includes applications based on interaction between a quantum ensemble with transition moments and a mechanical oscillator with an electromagnetically polarized moving part. The moving part may be placed close to the quantum ensemble so that the electromagnetic radiation field associated with the oscillator motion couples to the transition moments to transfer energy from the quantum ensemble to the mechanical oscillator and to reduce the entropy of the quantum ensemble. The oscillation frequency of the oscillator may be near or in resonance with the resonant frequency of the quantum ensemble to achieve a high transfer efficiency. The advantages of states of such reduced entropy include the ability to cool the surroundings of a system in such states, the low level of statistical uncertainty, and the strong interaction with specific frequencies of electromagnetic radiation. In another implementation, the energy may be transferred from the oscillator to the quantum ensemble to reduce the motion of the oscillator.

DETAILED DESCRIPTION

Figure 1:
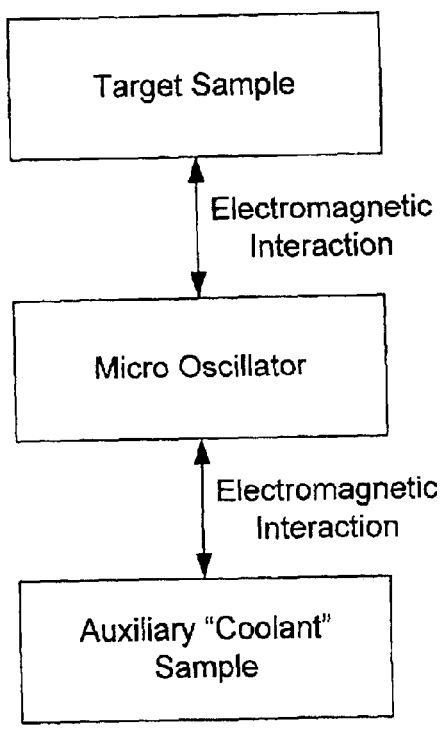
FIG. 1 shows one embodiment of a system with an oscillator for implementing the transfer of order between a quantum ensemble and an oscillator.

This application describes a novel class of apparatus and methods for manipulation and measurement of matter by electromagnetic interactions. In particular, these methods and devices may be used to transfer order between objects to achieve a decrease of entropy in a subsystem through interaction with radiation fields. The methods or techniques explore new uses of electromagnetic fields, materials which respond to those fields, and oscillators which may be electromagnetic or mechanical.

In general, a suitable system to which the present devices and methods are applicable may be an ensemble of particles that exhibit quantum-mechanical transition moments between discrete energy levels when interacting with another object or an electromagnetic field. Such transition moments may include magnetic transition moments (e.g., magnetic dipole moment or a higher order magnetic moment), electric transition moments (e.g., electric dipole moment or a higher order electric moment), or a combination of both. Effects of magnetic dipole and electric dipole transition moments frequently dominate in some applications. As another example, some of the subsystems whose entropy is to be reduced may be usefully described as ensembles of spins ½ with two quantum states, for example, when the dominant interaction of the radiation field is with the intrinsic angular momentum of nuclei or unpaired electrons in the system. In other cases the spins ½ may be fictitious, corresponding to pairs of energy levels in materials whose relevant energy level structure is more complex. Other subsystems may be usefully described as harmonic oscillators, such as single modes of electromagnetic fields in cavities. In some cases a mechanical oscillation will be associated with the coordinate of the harmonic oscillator, in addition to the electromagnetic oscillation. Hence, in one implementation, the interaction of some of the devices and methods disclosed herein is between the field of the oscillator and the moments of the spin or other system of discrete levels. The following description will use spins as an example to represent an ensemble of particles that exhibit quantum-mechanical transition moments.

The techniques of this application use enhanced radiative coupling of spins and oscillators to transfer order between them. A suitable oscillator may be a micro oscillator such as a micro mechanical oscillator with an electromagnetically polarized moving part and high quality factor. A micro electromagnetic resonator such as a RF cavity may also be used as an alternative oscillator. The order may be transferred in either direction, allowing cooling of spins by oscillators, and alternatively, cooling of oscillators by spins. The combination of such steps may allow the cooling of spins by spins at higher rates and over larger distances than is practical with some other cooling methods. The transfer of order between oscillators may also be used in some applications.

In one implementation, the coupling to spins of mechanical oscillators with magnetized parts may be used to reduce entropy of the spins, enabling sensitive magnetic resonance. Devices with such oscillators may be scaled down in size and thus may be analyzed based on a quantum-mechanical treatment of their interaction with the spins. Certain effects, which may be negligible at larger size scales, become significant and measurable in such micro devices, such as the coupling (vacuum Rabi frequency) of the ground state oscillator to the spins and the difference between radiative rates up and down the ladder of spin states, effects which vanish in approximate treatments that have been used to describe the coupling of spins to radiative degrees of freedom. From one viewpoint, the quantum fluctuations of the field of the oscillator couple to the transverse magnetic moment of the spins to create an enhanced spontaneous emission rate with which the spins towards a temperature which decreases with the energy of the oscillator. Sufficiently small, typically nanoscale, micro oscillators may be used to significantly increase or enhance the spontaneous emission rate which would otherwise be too slow to be useful or observable with conventional detection technqiues. The fluctuations of the transverse spin magnetization are decreased as the spins are ordered.

Certain aspects of this magnetic coupling of spins to magnetized mechanical oscillators may be formally analogous to cavity quantum electrodynamics, in which electric dipole transitions of atoms couple to the fields of electromagnetic cavities in ways that require inclusion of the vacuum Rabi frequency. In the present invention, oscillatory transfer of energy or of action between the spins and a mechanical oscillator near a spin resonance frequency may occur. By timing the period of interaction, the process may be stopped near a minimum of energy in one subsystem or the other. For example, if the spin system in a magnetic field is repeatedly put into interaction with a mechanical oscillator prepared in a low energy state over a sufficiently period of time to transfer its spin energy to that oscillator, then the net effect will be to increase the order of the spin system by polarizing the spins in the magnetic field to a greater degree at a faster rate than would be possible without the interaction with the oscillator. The mechanical oscillator may be designed to have a resonant frequency that is substantially equal to a resonant frequency of the spin system to facilitate the transfer. In a spin system with a distribution of different spin frequencies, either or both of the oscillator frequency and the spin frequency may be tuned to achieve the above resonance condition successively for the different spin frequencies for efficient exchange of energy and order.

A similar exchange may occur under conditions where damping of the oscillator, or the spins, or both the oscillator and the spins substantially eliminates the oscillations, or where the interaction of the oscillator and the spins is much briefer than the oscillation period. In these cases, the process can be viewed in terms of rates. One criterion is that this new radiative spin flip rate be sufficient to observably compete with spin lattice relaxation rates that tend to drive the spins into equilibrium with the sample temperature. By arranging that the radiative rate is appreciably large, the spins may be polarized more quickly and may even be driven toward a certain degree of polarization that is characterized by a temperature lower than the sample temperature.

In addition to coupling of the oscillator to spin precession at the Larmor frequency, it may be desirable to use resonant couplings of an oscillator whose frequency is near a resonant frequency of the spin system as modified by the presence at the spin system of an additional coherent alternating electromagnetic field. Such an irradiated spin system is described as a quantum-mechanical dressed-state system in which allowed radiative transitions occur at lower frequencies and couple to different field directions. For example, an applied radiation field near the Larmor frequency of the spin system may be applied to radiatively cool the spin system by a cold oscillator with frequency near the Rabi frequency corresponding to the interaction of the applied field and the spin system. In this case it is the longitudinal component of the spin magnetization which couples to the field of the oscillator.

Conversely, such a coincidence between the Rabi frequency of a highly polarized ensemble of two-level systems and an oscillator with an associated field at this ensemble can allow the oscillator to be cooled by the ensemble. The high polarization of the two-level system in the absence of the applied coherent radiation field may, for example, result from it having an energy splitting which is much higher than the thermal energy kT so that it is highly polarized at equilibrium at temperature T. In order to transfer this polarization to the dressed-states in the presence of the coherent radiation field, the radiation field may be swept into resonance or near resonance from below resonance or may be "spin-locked" (also known as "photon-locked" in the context of electric dipole transitions) so as to have the greater part of the population in the dressed states that correlate adiatically with the ground state of the system without the coherent radiation field. In addition to such transient situations, a steady-state polarized dressed state system may be maintained by continuous irradiation below resonance, in which case the dressed-state transition frequency to be matched to the oscillator frequency is the square root of the squares of the Rabi frequency and the resonance offset frequency.

The dressed-state transition dipoles near resonance can be large when the difference in static dipole moment between the two unperturbed levels are large. Thus molecules with large electric dipole moment differences between states which can be coupled by an applied coherent field will be of interest in this regard for the case where the oscillator field at the two-level system is an electric field. An example is a mechanical oscillator with a ferroelectric or other electret crystal attached so that the mechanical motion modulates the position or orientation of the field of the electret at the location of the two-level systems and at the frequency of the dressed-state transition. When an electric interaction with the auxiliary sample is used to cool the oscillator, but the target system to be polarized is a spin system with magnetic dipole transitions, then the oscillator should have both electric and magnetic fields at the respective samples, as may be achieved by attaching both an electret and a magnet to the same mechanical oscillator.

One reason for ordering spins is to increase the sensitivity with which their magnetic resonance spectra or images may be observed. By ordering spins by the methods of the present invention and subsequently performing such measurements on them, the sensitivity of various forms of magnetic resonance is increased when various detection methods are used including many conventional detection methods. Hence, the above entropy reducing techniques may be used as part of a measurement process where the a sample may be cooled by interacting with an oscillator. After the cooling, the sample is then measured or imaged to achieve a high signal to noise ratio. Because spin order persists for periods long enough to transport molecules into a great variety of conditions of temperature and thermodynamic phase, this increase in sensitivity is quite general and may be used in various applications. For example, the spins so ordered may be used as tracers for molecular transport or reactions.

An inverse process, in which the net energy transfer is from the oscillator to the spin system, is also of interest as a way of reducing the magnitude of the oscillator motion. This would require that the spin system be previously ordered by a suitable mechanism. Because this process causes the oscillator to be in a lower energy state, possibly out of equilibrium with its surroundings, this inverse process could play the role of preparing the oscillators for subsequent use in ordering other spins. Another class of uses for oscillators in low amplitude states is as detectors of events which change their amplitude.

The oscillating field needed to couple the oscillator and the transition moments may alternatively be obtained by placing one or more of the samples involved on a mechanical oscillator moving through the electric or magnetic field of a stationary source. For example, a translational motion at the Larmor frequency of a spin-bearing oscillator through a field gradient can also create the conditions for radiative coupling of the spin system and oscillator. Various methods of cooling spins that are compatible with the spins being part of a mechanical oscillator include optical nuclear polarization or injection of a current of spin polarized electrons. This order can then be transferred to the oscillator as its motion is damped by transfer of mechanical energy to the cold spins. This cold oscillator may also be configured for use as a detector of various forces in known ways. It may also be used to cool other spins as described in this invention. For example, these other spins may also reside on the oscillator at a position in the field gradient at which their Larmor frequency matches the oscillator frequency. Alternatively, they may reside nearby in a region where they experience the oscillating field of a moving magnet attached to the oscillator. The coincidence between oscillator frequency and the transition frequency of spin populations with different gyromagnetic ration may be achieved simultaneously, by having different static magnetic fields at the different sites of the spins, or sequentially, by varying the static magnetic field so that cooling of the oscillator and cooling of the spins occur alternately within a time period short or comparable to the decay time (ringdown time) of the oscillator.

The techniques of transferring order of this application may be practiced with various systems for measurement of spin polarization or its fluctuations. In certain measurement procedures, the effect of the back action of the device on the system to be measured has been viewed as a problem to be avoided in some applications. In the present invention, however, this back action is beneficially utilized to transfer order between the subsystems. In certain such modes of operation, no measurement is necessary and it suffices to put the spin system into the device which has been used for application of alternating fields and recording of the response of the system to those fields. In the present use of such apparatus, a period of simply waiting (or of performing other operations described as enhancing the radiative damping) would increase the signal available for measurement. Small size scales of the oscillators used in this application coupled with low operating temperatures make it possible that the radiative rates are observably large compared to other rate processes, such as spin-lattice relaxation.

In such measurement applications, it is desirable that the spin systems be ordered and that the apparatus is at a low temperature. Examples of suitable apparatus are those that have been proposed for detection of transverse magnetization by magnetic resonance force microscopy (MRFM) and BOOMERANG force-detected magnetic resonance. The mechanical oscillator motion may be torsional, linear or a combination of such motions. Specific examples are described herein. For example, any apparatus (designed to be) driven (solely) by the evolution of the spins exchanges energy with the spins. This energy exchange may lead to ordering of the spins, if, as a result of the initial condition of the apparatus and the spins, the exchange of energy is from the spins to the apparatus. For example, the ordering of the spins along the longitudinal direction occurs as the result of the damping of the fluctuations of the transverse spin magnetization components by a cold oscillator that couples to the transverse components.

Notably, the measurement of this exchange within the same device is not required for the present procedure of transferring order. Therefore, a range of devices may be used to transfer order, including but not limited to, devices in which no measurement is implemented or devices in which measurement is known to be impractical. For example, devices with very small oscillators, may be detrimentally perturbed by observation and thus are not usable for application requiring measurements. Such devices, however, may be used to transfer order.

The requirement in some of the methods that the apparatus be prepared in a low energy state, motivates the enumeration of additional ways that this may be achieved. These include lowering the temperature of the apparatus. Alternatively, it will suffice to lower the energy of a relevant (harmonic oscillator) mode of the apparatus in a nonequilibrium fashion, in which the energy of the remaining modes may remain higher and may be approximately described as being at the ambient temperature. For example, oscillators brought to low energy states by some prior cooling procedure may be cycled through the apparatus so as to couple to and order the oscillator which is in turn closely coupled to the spin system. Another alternative is that energy may be extracted from the oscillator by a feedback scheme in which its thermal motion is monitored or observed, and the energy of the oscillator is actively reduced in response to the monitored thermal motion. Still another possibility is that the frequency of the oscillator is adiabatically reduced, so that at the lower final frequency it is in a state of reduced energy relative to its equilibrium state at the temperature of its surroundings.

An alternative to directly ordering a mode of the apparatus is to introduce a high nonequilibrium degree of order to the system as an auxiliary sample which is itself highly ordered by some prior step. This prior step may employ the cooling methods via an oscillator as described above or other suitable methods for ordering spins. This auxiliary sample may be coupled to the relevant mode of the mechanical oscillator through electromagnetic fields, so as to cool the mechanical oscillator and its associated radiation field. In particular, a variety of optical polarization schemes are known for ordering the spins of particular favorable samples, making these candidates for the auxiliary sample. By continuously or periodically replacing these auxiliary spins as they become disordered, the limited heat capacity of the volume in effective contact with the oscillator may be made unimportant to the cooling rate. Hence, various spin polarization methods may be used to transfer order by making possible the transfer of this polarization to systems of interest that otherwise cannot be directly polarized by such spin polarization methods.

Mechanical oscillators, as one implementation of the suitable oscillators for transferring order, may be designed to have usefully large quantum mechanical fluctuations and to be capable of engendering enhanced radiative rates in nearby systems. To this end, favorable properties for such oscillators may include a small size, a low resonant frequency, and a long ringdown time (i.e., high quality factor). The combination of these factors may be challenging to achieve because with a given design, the resonant frequency increases and the ringdown time typically decreases as the length scale of the design is reduced. An additional aspect of the invention is the recognition that these properties may be favorably achieved in oscillators that are levitated. Stable passive levitation of magnetic oscillators has been achieved in normal gravity by the combination of ferromagnetic and diamagnetic forces of nearby stationary material. Levitation of diamagnetic objects has been achieved in high magnetic fields. Levitation of diverse small solid objects and liquid droplets has been achieved by charging them and using active feedback control of electric fields to minimize their excursions. Replacing the mechanical suspension in the specified oscillators with such levitation methods comprises an aspect of the invention.

In some implementations of the invention the motion of ferromagnetic parts through magnetic fields or the time dependent magnetic field of a moving magnetic part at another part may induce eddy currents and an associated damping of the oscillator motion. This mechanism of oscillator damping may be minimized by using parts with low electrical conductivity at the mechanical frequency. Ferromagnets with low conductivity may be obtained by intentional introduction of impurities and/or by forming composites in which smaller ferromagnetic parts are coated with insulating material and combined.

Spin-lattice relaxation processes may be used as the mechanism for exchange of energy and entropy between spins and other degrees of freedom. Polarized spins are well-known to play a useful role in refrigeration cycles aimed at cooling solids to extremely low temperatures through spin-lattice relaxation. In the process of adiabatic demagnetization polarized spins are cycled from a high magnetic field to a low magnetic field lowering their spin temperature so that they are able, through spin-lattice relaxation processes, to cool other degrees of freedom toward lower temperature. The present invention makes it possible to produce highly polarized spins in diverse materials and thus enables the use of spin-lattice processes to cool such samples, with or without the use of adiabatic demagnetization to further lower the spin temperature.

FIG. 1 shows the general system design for implementing the above techniques for reducing the entropy of a target sample a quantum ensemble or a micro oscillator which is electromagnetically polarized. The oscillator and the target sample are placed within each other's electromagnetic field to cause interaction. When the entropy of the target sample is to be reduced, an auxiliary coolant sample with a higher order and lower entropy may be placed in electromagnetic interaction with the oscillator to extract energy from the oscillator which in turn extracts energy from the target sample. In general, the oscillator and the target sample may be placed in a near field region from each other. The micro oscillator in FIG. 1 may be implemented by a micro microwave resonator or a micro mechanical oscillator with a polarized moving part. The following describes three exemplary mechanical oscillators.

Figure 2:
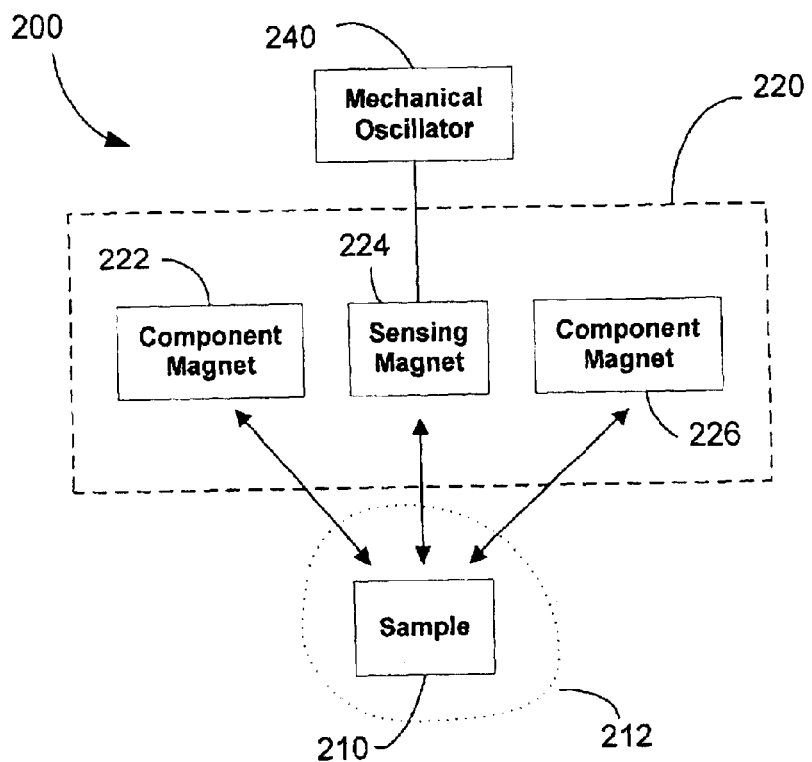
FIG. 2 shows a force-detected magnetically-coupled oscillator suitable for application in FIG. 1.

FIG. 2 shows a force-detected magnetic resonant oscillator system 200. Certain features of this system is disclosed in U.S. Pat. No. 6,100,687. A composite magnet assembly 220 has a plurality of component magnets 222, 226, and 226 that are distributed in a prespecified geometry with respect to a location 212 for placing a sample 210. The composite magnet assembly 220 is designed to produce a static magnetic field. The composite magnet assembly 220 and the sample 210 are arranged with respect to each other so that the static magnetic field at the site of the sample 210 is substantially homogeneous. The degree of the field homogeneity for the static magnetic filed at the sample 210 may be characterized by the line broadening caused by the field inhomogeneity. The line broadening caused by the inhomogeneity is preferably smaller than the Rabi frequency. For example, a relative variation in the field magnitude across the sample 310 is approximately about 1 part per million or less. Under such a homogenous condition, the total magnetic force exerted on the sample 210 by the magnet assembly 220 as a whole is substantially zero. According to the Newton's third law, the "inverse" magnetic force exerted on the composite magnet assembly 220 as a whole by the sample 210 is also substantially zero.

One of the magnets in the composite magnet assembly 220, e.g., the magnet 224, may be designed to be sufficiently small as a movable sensing magnet and other magnets 222 and 226 are fixed to be stationary. The micro mechanical oscillator 240 is fixed to the sensing magnet 224 and thus moves in response to the magnetic force acted on sensing magnet 224. The sensing magnet 224 is placed in the field produced by the sample 210 to electromagnetically interact with the sample 210. Assume the magnetic field at the sample 210 due to the various magnets 222 and 224 is homogenous and is along the vertical (longitudinal) direction. A horizontal (transverse) oscillation of the sensing magnet/oscillator structure or a torsional motion around a transverse axis can be coupled to the transverse magnetization. The frequency of the oscillation may be adjusted to be close to the Larmor frequency of the spin of the sample 210. Either of such oscillator motions could then play the role of exchanging energy and entropy with the sample 210, which depending on the sign of this exchange could be the auxiliary cooling sample or the target sample. These modes could also be driven by the resulting enhanced magnetization of the sample 210 in a subsequent magnetic resonance experiment which uses resonant rf to turn the enhanced magnetization to the transverse direction for detection.

FIG. 2 may also be used to illustrate the coupling of the longitudinal magnetization of the sample 210 to the longitudinal oscillation of the sensing magnet/oscillator. The magnetization (enhanced, for example, by coupling to transverse motions as above) could be detected by using a resonant rf field near the Larmor frequency to cyclically invert the longitudinal magnetization near the mechanical resonance frequency of the longitudinal motion of the oscillator 240. The longitudinal motion of the sensing magnet 224 and mechanical oscillator 240 can additionally be used to cool this degree of freedom by using a sample 210 which is highly polarized and by applying to it irradiation that creates dressed-state transitions near the longitudinal mechanical resonance frequency.

Figure 3:
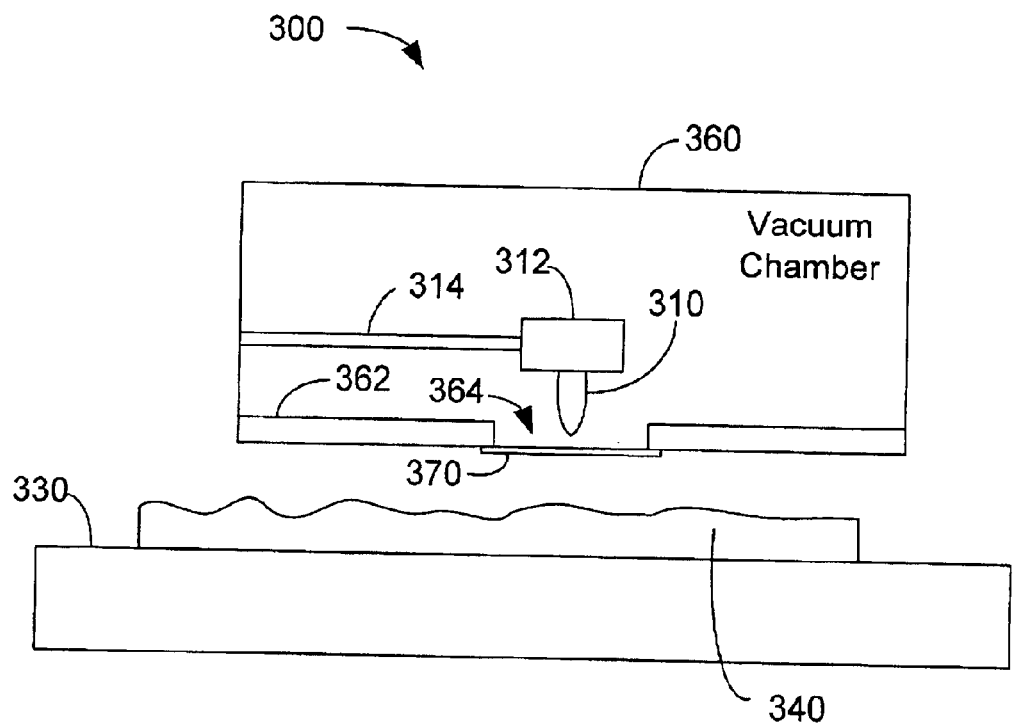
FIG. 3 shows a force-detected electric-dipole-coupled oscillator suitable for application in FIG. 1.

FIG. 3 shows one embodiment of a force-detected electric-dipole-coupled oscillator 300 suitable for application in FIG. 1. The basic design concept is to create and detect a force interaction between a sample 340 and a probe tip 310. The probe tip 310 is electrically polarized, e.g., exhibiting an electric dipole moment. A mechanical oscillator 314 is used to hold a probe base 312 which supports the probe tip 310. The sample 340 and the probe 310 interact with each other to make the mechanical oscillator 314 move in response to the sample-probe interaction. The probe 310 and the mechanical oscillator 314 are shown to be in a vacuum chamber 360 to reduce the damping and to enhance the sample-probe interaction. A semiconductor substrate 362 may be used as the vacuum wall. A through opening 364 is formed on the substrate 362 to receive the probe tip 310. A thin film 370 such as a silicon nitride membrane may be formed to seal off the opening 364. The sample 340 may be held by a sample holder 330 such as a substrate.

In one implementation, the sample 340 may be designed to have in close proximity to the tip 310 a molecule or quantum dot which by virtue of irradiation near an electronic resonance has an electric-dipole-allowed dressed-state transition near the mechanical resonance frequency of the oscillator 314. The resulting electromagnetic absorption of the field of the moving oscillator will reduce its motion, thus cooling it to a state where it could be used as a sensitive sensor of electric fields or electric field gradients or could be used to cool other spectroscopic systems in the sample.

Figure 4:
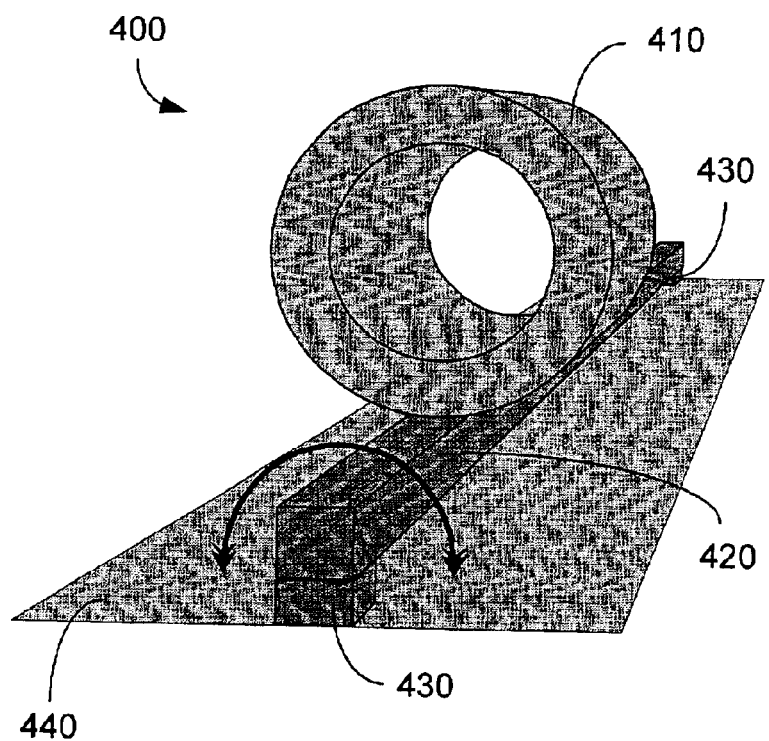
FIG. 4 shows a suspended magnetic cylinder oscillator suitable for application in FIG. 1.

FIG. 4 shows a torsional magnetic mechanical oscillator 400 suitable for application in FIG. 1. A Halbach magnetic cylinder 410 is engaged to a mechanical torsional suspension bar 420. The suspension bar 420 is supported by two support members 430 mounted on a surface 440. The magnetization of the cylinder 410 may be designed to vary between radial and circumferential as $\sin(2\phi)$, where $\phi=0$ is the vertical direction (the direction of the static field inside the cylinder). In this design, a torsional motion can create an oscillating transverse field and has the property that both the static longitudinal field and the transverse field are homogeneous near the center of the cylinder 410. An alternative is a donut with the magnetization parallel to the symmetry axis and mounted to undergo torsion around a perpendicular axis. The target sample and auxiliary sample with magnetic-dipole allowed transitions are placed in or near the cylinder so that their respective Larmor frequencies are simultaneously or sequentially near the torsional frequency of the mechanical oscillator. This arrangement facilitates the transfer of spin order between the auxiliary sample and the target sample through the coupling of each to the torsional oscillator. This assembly can also be used as a sensor of the transverse magnetization by providing an additional rf magnetic field along the cylinder axis to resonantly manipulate (e.g. spin lock) the enhanced magnetization of the target so that it is transverse and thus drives a torsional motion in proportion to its amplitude.

The transfer of order may also be used to use a "cold" oscillator to cool a "hot" oscillator by bringing them to electromagnetic interaction with each other in a way similar to the cooling of an oscillator with a coolant sample system. The cooling oscillator may be prepared to be "cold", e.g., by transferring order to another quantum ensemble prior to coupling of the two oscillators. This cold oscillator is then placed adjacent to the hot oscillator to extract energy out of the hot oscillator. The above process may be repeated by sequentially using other cold oscillators to cool the hot oscillator until the hot oscillator reaches a desired energy state.

Only a few embodiments are disclosed. However, it is understood that variations and enhancements may be made without departing from the spirit of and are intended to be encompassed by the following claims.

What is claimed is:

1. A method, comprising:
   providing a sample of a quantum ensemble of particles with transition moments operable to interact with an electromagnetic field, and a mechanical oscillator with a separate electromagnetically polarized moving part attached to said mechanical oscillator which produces said electromagnetic field; and
   placing said polarized moving part attached to said mechanical oscillator close to said quantum ensemble of particles, whereby said quantum ensemble of particles and said polarized moving part of said mechanical oscillator interact with said electromagnetic field to transfer energy from said quantum ensemble to said mechanical oscillator and reduce an entropy of said quantum ensemble of particles.

2. The method as in claim 1, further comprising:
   monitoring thermal motion of said polarized moving part of said mechanical oscillator; and
   extracting energy from said mechanical oscillator in response to the monitored thermal motion to reduce the thermal motion.

3. The method as in claim 1, further comprising coupling said mechanical oscillator with an auxiliary sample in order to electromagnetically interact with, and transfer energy from, said mechanical oscillator to said auxiliary sample.

4. The method as in claim 1, wherein said auxiliary sample is in a nonequilibrium degree of order prior to an electromagnetic interaction with said mechanical oscillator.

5. The method as in claim 1, wherein said mechanical oscillator is mainly magnetically polarized.

6. The method as in claim 1, wherein said mechanical oscillator is mainly electrically polarized.

7. The method as in claim 1, wherein said quantum ensemble of particles includes particles of spins.

8. The method as in claim 1, wherein said mechanical oscillator includes a composite magnet assembly which includes the polarized moving part as a movable sensing magnet, and a plurality of stationary magnets, wherein a net magnetic field produced by said composite magnet assembly at said quantum ensemble of particles is spatially homogenous.

9. The method as in claim 1, wherein said mechanical oscillator includes a mechanically suspended magnetic cylinder as said polarized moving part.

10. The method as in claim 1, wherein said mechanical oscillator includes a mechanically suspended, electrically polarized unit.

11. The method as in claim 1, further comprising: after said entropy of said quantum ensemble of particles is reduced, measuring said quantum ensemble of particles to obtain information about said quantum ensemble of particles.

12. The method as in claim 1, wherein said mechanical oscillator has a resonant frequency at or near a resonant frequency of said quantum ensemble of particles.

13. A method, comprising:
   providing a sample of a quantum ensemble of particles with transition moments operable to interact with an electromagnetic field, and a mechanical oscillator with a separate electromagnetically polarized moving part attached to said mechanical oscillator which produces said electromagnetic field; and
   placing said polarized moving part of said mechanical oscillator close to said quantum ensemble of particles, whereby said quantum ensemble of particles and said polarized moving part of said mechanical oscillator interact with said electromagnetic field to transfer energy from said mechanical oscillator to said quantum ensemble of particles and reduce a magnitude of motion of said mechanical oscillator.

14. The method as in claim 13, wherein said quantum ensemble of particles is in a nonequilibrium degree of order prior to an electromagnetic interaction with said mechanical oscillator.

15. The method as in claim 13, further comprising transferring energy out of said quantum ensemble of particles to reduce entropy thereof prior to interaction with said mechanical oscillator.

16. The method as in claim 15, further comprising using another mechanical oscillator to electromagnetically interact with said quantum ensemble of particles to transfer energy out of said quantum ensemble of particles.

17. The method as in claim 13, wherein said quantum ensemble of particles includes particles of spins.

18. The method as in claim 13, wherein said mechanical oscillator includes a composite magnet assembly which includes the polarized moving part as a movable sensing magnet, and a plurality of stationary magnets, wherein a net magnetic field produced by said composite magnet assembly at said quantum ensemble of particles is spatially homogenous.

19. The method as in claim 13, wherein said mechanical oscillator includes a mechanically suspended magnetic cylinder as said polarized moving part.

20. The method as in claim 13, wherein said mechanical oscillator includes a mechanically suspended, electrically polarized unit.

* * * * *